(12) United States Patent
Leonardi et al.

(10) Patent No.: US 10,805,990 B2
(45) Date of Patent: Oct. 13, 2020

(54) COOLING SYSTEM FOR AN INDUCTION HOB

(71) Applicant: WHIRLPOOL CORPORATION, Benton Harbor, MI (US)

(72) Inventors: Luca Leonardi, Oleggio (IT); Daniele Massimiliano, Cassinetta (IT); Luca Zilio, Cassinetta (IT)

(73) Assignee: Whirlpool Corporation, Benton Harbor, MI (US)

( * ) Notice: Subject to any disclaimer, the term of this patent is extended or adjusted under 35 U.S.C. 154(b) by 5 days.

(21) Appl. No.: 15/141,218

(22) Filed: Apr. 28, 2016

(65) Prior Publication Data

US 2016/0323938 A1    Nov. 3, 2016

(30) Foreign Application Priority Data

Apr. 28, 2015 (EP) .................................. 15165520

(51) Int. Cl.
| | |
|---|---|
| *H05B 6/12* | (2006.01) |
| *F24C 15/10* | (2006.01) |
| *F24C 15/00* | (2006.01) |
| *H01L 23/467* | (2006.01) |

(52) U.S. Cl.
CPC ......... *H05B 6/1263* (2013.01); *F24C 15/006* (2013.01); *F24C 15/101* (2013.01); *H01L 23/467* (2013.01)

(58) Field of Classification Search
CPC .... F24C 15/101; F24C 15/006; H05B 6/1263; H05B 2206/022; H01L 23/467; H01L 23/3672
USPC ................................ 165/80.3; 219/623, 632
See application file for complete search history.

(56) References Cited

U.S. PATENT DOCUMENTS

| | | | |
|---|---|---|---|
| 2005/0094375 A1 | 5/2005 | Chiang et al. | |
| 2008/0142512 A1* | 6/2008 | Kim ...................... | F24C 15/101 219/757 |
| 2008/0151505 A1 | 6/2008 | Chen et al. | |
| 2010/0219179 A1* | 9/2010 | Lin ........................ | F24C 15/101 219/623 |
| 2012/0152933 A1* | 6/2012 | Matsui ................. | H05B 6/1263 219/623 |
| 2013/0014921 A1 | 1/2013 | Chen et al. | |

FOREIGN PATENT DOCUMENTS

| | | | |
|---|---|---|---|
| DE | 202011102973 | * | 12/2011 |
| DE | 102013107090 | * | 1/2015 |
| DE | 102013107090 A1 | | 1/2015 |
| EP | 1936283 A2 | | 6/2008 |

OTHER PUBLICATIONS

European Patent Office, European Search Report and Opinion for European Patent Application No. 15165520.6-1808, dated Sep. 29, 2015, 7 pages.

* cited by examiner

*Primary Examiner* — Eric S Ruppert
(74) *Attorney, Agent, or Firm* — Price Heneveld LLP

(57) ABSTRACT

A cooling system for a built-in induction hob with an improved cooling efficiency, and a cooling method thereof. The cooling system comprises an air blower for generating an airflow according to a first direction, a heat-sink device through which air blown by the air blower is conveyed. The cooling system further comprises airflow deflecting means for deflecting said airflow from said first direction to a second direction which significantly deviates from said first direction.

19 Claims, 4 Drawing Sheets

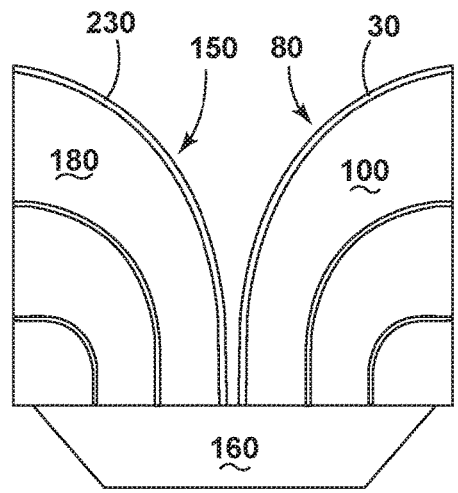
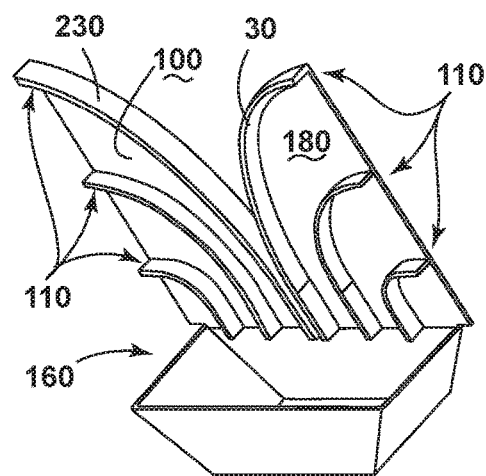
FIG. 4A  FIG. 4B
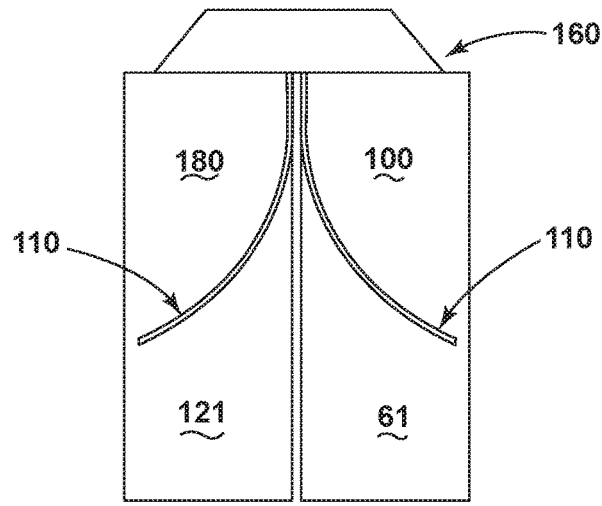
FIG. 5A
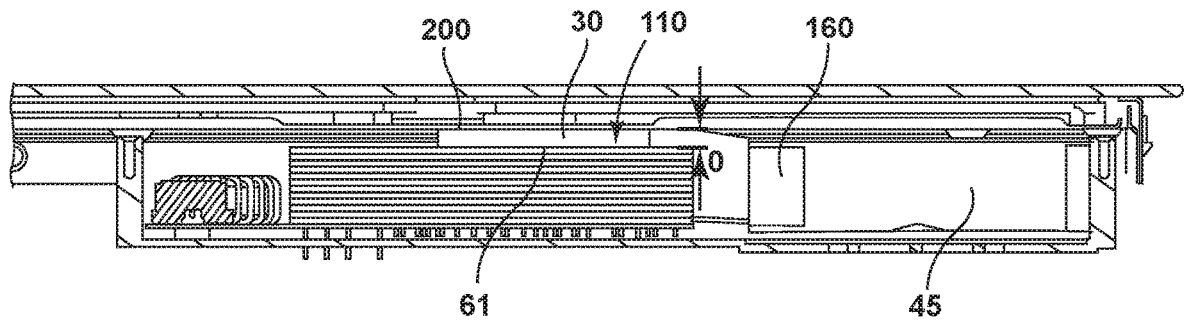
FIG. 5B

COOLING SYSTEM FOR AN INDUCTION HOB

CROSS-REFERENCE TO RELATED APPLICATION

This application claims priority to European Patent Application No. EP 15165520.6, filed Apr. 28, 2015, entitled "COOLING SYSTEM FOR AN INDUCTION HOB," the disclosure of which is incorporated herein by reference in its entirety.

BACKGROUND

The present disclosure relates to a cooling system for an electric hob, particularly for an induction cooking hob. Induction cooking hobs are equipped with electronic boards on which are placed electronic components that need to be cooled, for instance power devices such as triacs or IGBTs.

Normally, some of the electronic components are placed on such electronic boards together with heat-sinks to which they are connected, for dissipating heat. However, in operation these electronic components may reach high temperatures which can become critical for the reliability and lifetime of the same components. In such critical conditions it is crucial to provide an effective cooling in order to avoid failures.

In a known solution to the above problem, the cooling system has electronic components directly mounted on the heat-sink which are then cooled through forced convection systems. In other solutions an airstream impinges directly the heat-sink and the electronic devices connected thereto.

However, not only the power electronic components directly mounted on the heat-sink need to be cooled, but also other components placed in a different area of the electronic board, such as big capacitors.

According to the present invention, the above mentioned problems are solved through a cooling system for an induction hob, especially a built-in induction hob, in which the whole airflow generated by the blower is intensively used to cool down all the components, before being exhausted.

These results are achieved by the present invention according to the features in appended claim 1 alone, or in combination with the dependent claims.

SUMMARY

According to one aspect of the present disclosure, a cooling system for an induction cooking hob is provided. The cooling system for an induction cooking hob includes an air blower for generating an airflow according to a first direction, a heat-sink device through which the airflow blown by the air blower is conveyed, and an airflow detecting means cooperating with the heat-sink device for deflecting at least a portion of the airflow from the first direction to a second direction which deviates from the first direction.

According to another aspect of the present disclosure, a cooling system for an induction cooking hob is provided. The cooling system for an induction cooking hob includes an air blower for generating an airflow according to a first direction, a heat-sink device through which the airflow blown by the air blower is conveyed, and an airflow deflecting means cooperating with the heat-sink device for deflecting at least a portion of the airflow from the first direction to a second direction which deviates from the first direction. The heat-sink device has a plurality of radiant elements protruding from a common base, the radiant elements being disposed substantially parallel according to the first direction. The radiant elements are fins obtained through material extrusion according to a longitudinal direction which corresponds to the first direction According to yet another aspect of the present disclosure, a cooling system for an induction cooking hob is provided. The cooling system for an induction cooking hob includes an air blower for generating an airflow according to a first direction, a heat-sink device through which the airflow blown by the air blower is conveyed, and an airflow detecting means cooperating with the heat-sink device for deflecting at least a portion of the airflow from the first direction to a second direction which deviates from the first direction. The cooling system for an induction cooking hob further includes two heat-sink devices symmetrically disposed facing each other and spaced apart, the airflow detecting means being provided with two deflectors disposed in a butterfly shaped on the heat-sink devices. A first deflector is provided with a curved side wall for deflecting said airflow from the first direction to the second direction. A second deflector is provided with a curved side wall for deflecting the airflow from the first direction to a third direction which deviates from the first direction.

These and other features, advantages, and objects of the present device will be further understood and appreciated by those skilled in the art upon studying the following specification, claims, and appended drawings.

BRIEF DESCRIPTION OF THE DRAWINGS

Further features and advantages of the method according to the present disclosure will become apparent from the following detailed description of a preferred embodiment, meant as a not limiting example of the present disclosure, described in combination with the appended drawings, in which:

FIG. 4A is a bottom view of an alternative embodiment of the deflector means of FIG. 3A;

FIG. 4B is a perspective view of an alternative embodiment of the deflector means of FIG. 3B;

FIG. 5A is a top view of an alternative embodiment of airflow distributing means of FIG. 4A according to the present invention;

FIG. 5B is a sectional view of an assembled hob comprising the airflow distributing means of FIG. 5A.

DETAILED DESCRIPTION OF EMBODIMENTS

Figure 1:
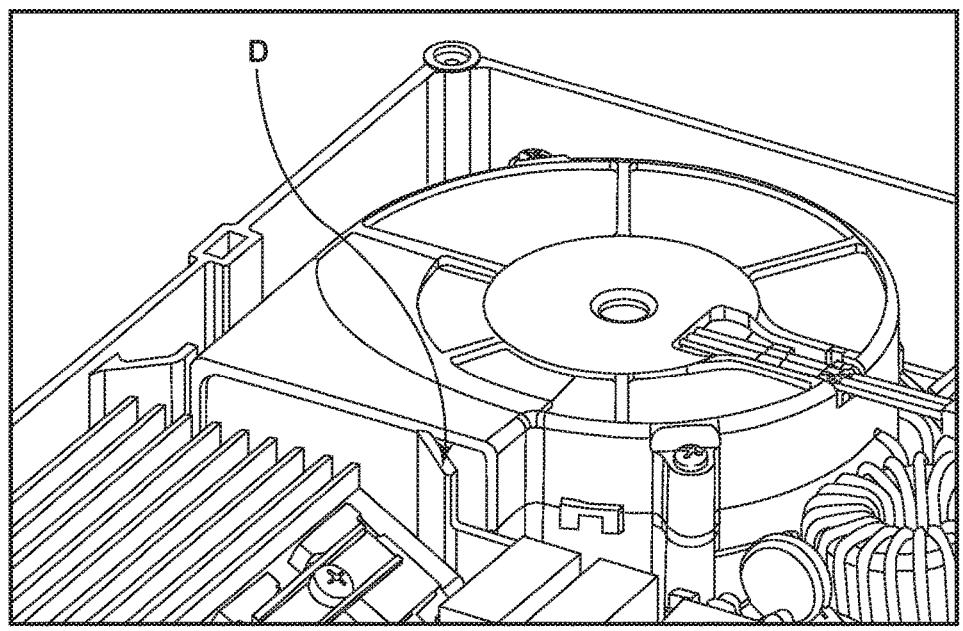
FIG. 1 describes a cooling system according to prior art.

For purposes of description herein the terms "upper," "lower," "right," "left," "rear," "front," "vertical," "horizontal," and derivatives thereof shall relate to the device as oriented in FIG. 1. However, it is to be understood that the device may assume various alternative orientations and step sequences, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

In another known solution represented in FIG. 1, the airstream generated by a centrifugal blower is divided at the outlet of the air blower into two parallel flows through a flow divider D, in which the first flow impinges directly on the heat-sink and the second flow is directed laterally towards the other components of the electronic board. Such flow dividers are usually embedded in the housing of the blower. However, required for implementing this solution is a blower provided with a sufficient cooling capacity for generating two parallel airstreams required for cooling down both the heat-sink with the connected components and the other electronic components placed in different areas of the electronic board. This solution is not sufficiently compact for "built-in" systems, especially for built-in induction hobs, and it is not particularly efficient because it does not exploit intensively the cooling capacity of the overall airflow generated by the blower. In particular, the efficiency of the second flow directed laterally towards the other components of the electronic board is far from the saturation level of the same airstream cooling capacity, so that it is exhausted with a temperature that is still "fresh" for being used to cooling down other components.

Figure 2A:
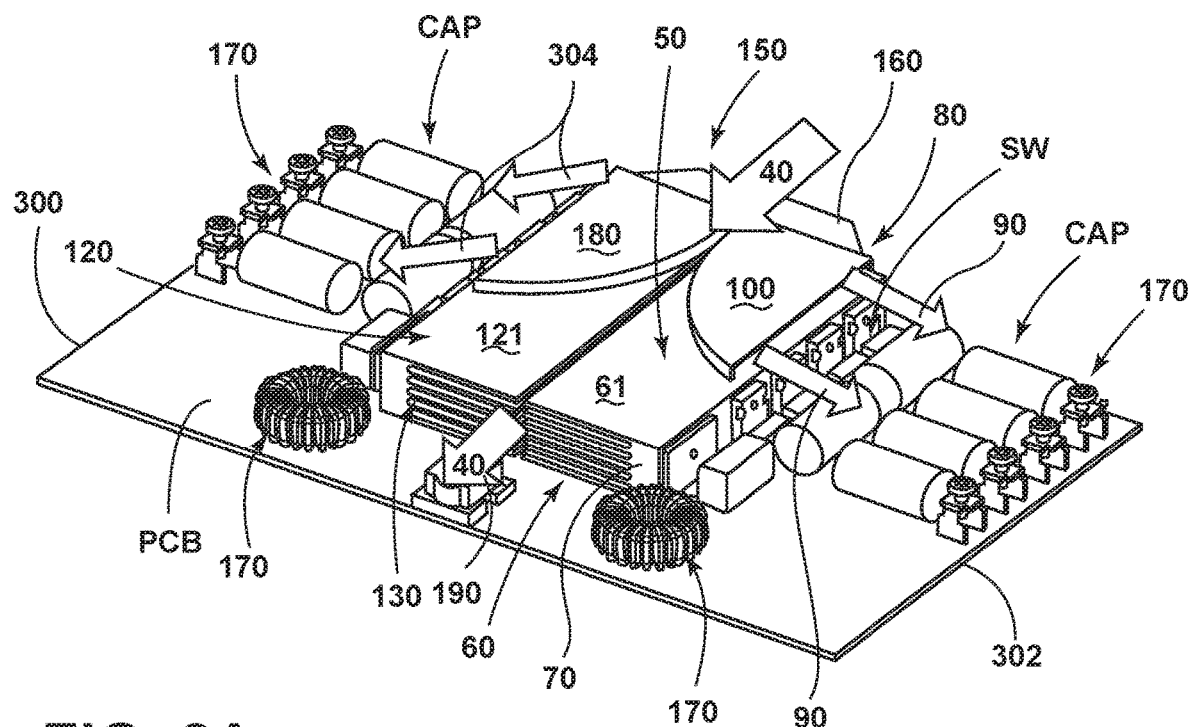
FIG. 2A shows a perspective front view of a detail of the cooling system according to the present disclosure.
Figure 2B:
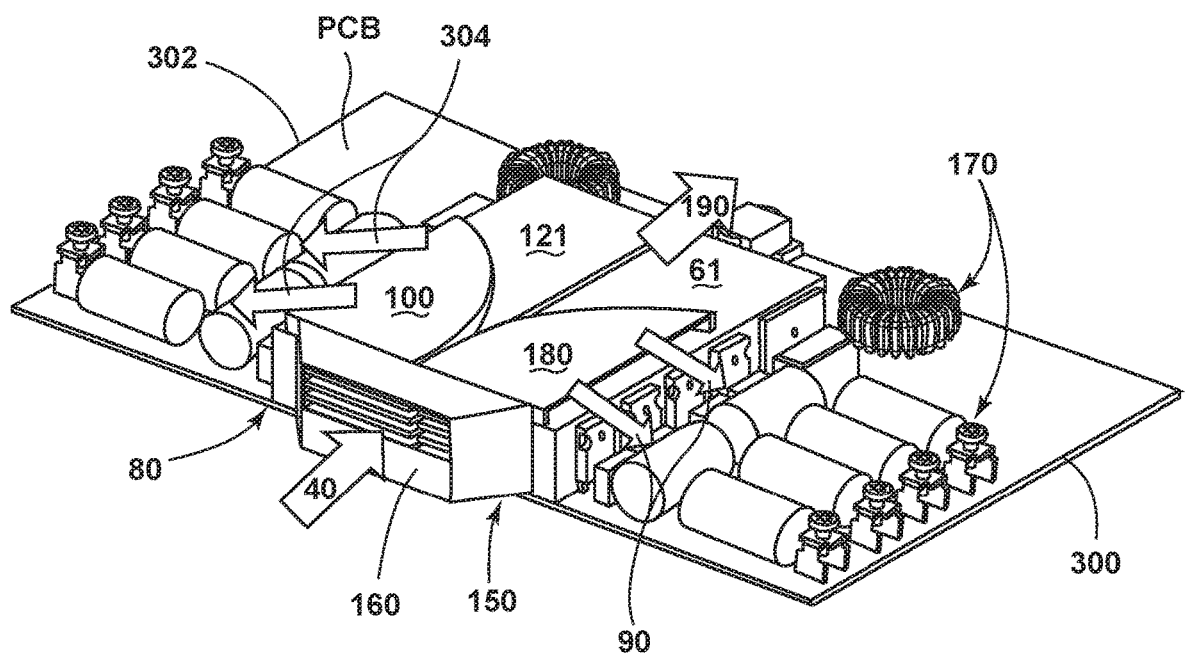
FIG. 2B shows a perspective rear view of the system of FIG. 2A.

In FIGS. 2A and 2B an electronic board PCB configured for supporting electrical and electronic components of an induction cooking system is shown. Said board PCB has a first side 302 and a second side 300 and includes: a power module comprising a voltage rectifier, electric filters, solid state switches SW such as IGBTs, triac or the like, a power converter module comprising a plurality of solid state switches SW, and components belonging to the resonant circuit, such as "big" capacitors CAP and electrical connection to inductors. Due to their intensive use, especially solid state switches SW and the big capacitor CAP increase their temperature.

For this reason switches SW are thermally connected to at least one heat-sink device 50 for dissipating heat, and the heat-sink is further cooled through an airflow 40 generated by an air blower 45 of the type known in the art, preferably a centrifugal blower 45. Other electronic components (including capacitors CAP) are cooled through at least one deflected airflow 90 generated by the same air blower 45, which impinges on the components.

According to the present disclosure the heat-sink device 50 is a metal heat dissipating body provided with a common base 70 to which switches SW are connected in a heat exchange relationship, from which radiant elements 60 depart through which heat is dissipated. Radiant elements 60 can be in the form of "fins" or "pins" or "fingers". According to the present disclosure such radiant elements 60 are disposed in parallel rows, preferably displaced at constant distance. However, differentiated spacing between the rows is compatible with the present disclosure and would result in a customization of the thermal gradient generated in the space surrounding the heat-sink 50.

Preferably, the heat-sink device 50 is obtained by metal extruded along a first (longitudinal) direction 40.

According to the present disclosure a blower 45 is facing frontally the heat-sink device 50 for generating, when activated, airflow according to a direction which is substantially parallel to the first direction 40. Such airflow is mainly conveyed through the radiant elements 60 of the heat-sink device 50.

According to the present disclosure the cooling system comprises air deflecting means 80 for deflecting a portion the airflow generated by the blower 45 from the first direction 40 to at least a second direction 90.

In such a way a separation of the generated airflow into two air flows is achieved: a first portion of the airflow directed through the radiant elements 60 of the heat-sink device 50, and a second deflected portion flowing in a direction that is no longer parallel to the extrusion direction (heat-sink). It is here pointed out that according to the present disclosure air deflection occurs after the airflow has already cooled at least one portion of the heat-sink device 50. According to the present disclosure the cooling capacity of the airflow is better exploited compared to prior art, in which separated airflows were used.

Preferably, the second portion of the airflow is deflected according to a second direction 90. Preferably, the second portion of the airflow which is deflected according to a second direction 90 is an "air spillage", that is a minor portion of the total airflow generated by the air blower 45 that does not continue according to the first direction 40.

In an alternative embodiment (not shown), air spillage is obtained through an opening or openings in the common base 70 of the heat-sink 50.

Preferably, the airflow deflecting means 80 extend partially on the heat-sink device 50, so that the airflow runs on a limited area of the outer surface of the heat-sink device 50 before it is deflected. As a result, the portion of the airflow deflected according to the second direction 90 has a temperature which is lower than the temperature of the air flow measurable at the outlet (end section) of the heat-sink device 50. In this manner it is possible to provide "used" but still "fresh" air to further cool down a specific group of electronic components, preferably positioned not in close connection with the heat-sink device 50 (far from the heat-sink for not being thermally influenced by it), especially big capacitors CAP of the resonant circuit. Preferably, the portion of the airflow deflected according to the second direction 90 impinges directly on at least one of said electronic components CAP not positioned in close connection with the heat-sink device 50.

According to a preferred embodiment of the present disclosure, a portion of the airflow flowing externally and above to the heat-sink radiant elements 60 is deviated from the first direction 40 to a second direction 90 by means of a deflector 100 provided with a curved side wall 30, which cooperates with the heat-sink. The deflector 100 is one part made of plastic. Such deflector 100 in cooperation with the heat-sink device 50, preferably with an outer surface of the heat-sink device 50, on which the deflector 100 is positioned, defines a curved duct through which the spilled air is deflected in order to provide cooling effect for the desired electronic components. Preferably the outer surface of the heat-sink is a substantially flat top surface 61 of the heat-sink device 50. A sealing can be optionally present to seal the duct. Additionally, the deflector 100 further comprises a plurality of ribs 110 (FIG. 4B) for improving airflow deflection from said first direction 40 to a second direction 90 which is preferably substantially transversal to said first direction 40. The additional ribs, substantially parallel to said curved side wall 30 are disposed to deflect the airflow in a more homogeneous manner. In an alternative embodiment said ribs 110 are set for deflecting said airflow from said first direction 40 to a plurality of second directions 90 which significantly deviates from said first direction 40 (FIG. 5A).

Figure 3A:
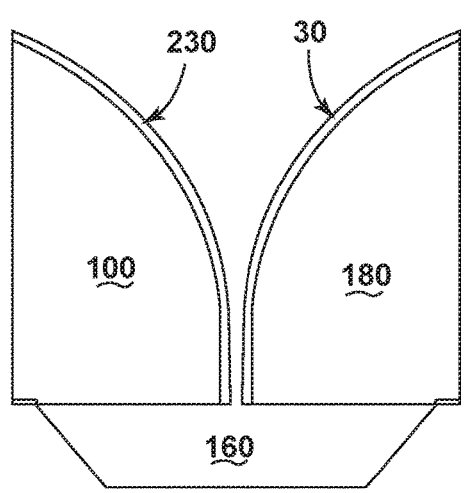
FIG. 3A shows a top view of an example of the deflector according to the present disclosure.
Figure 3B:
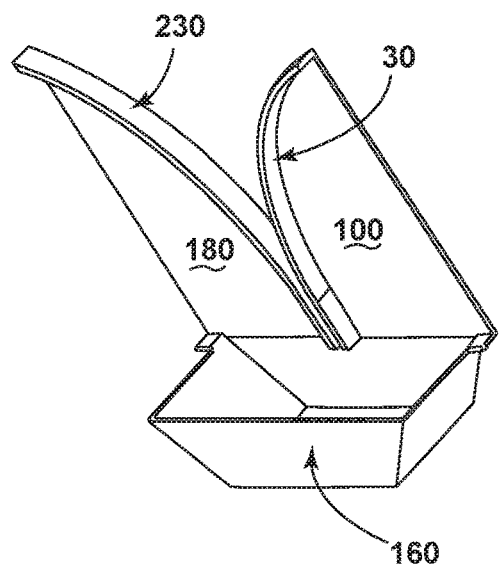
FIG. 3B shows a perspective view of an example of the deflector according to the present disclosure.

Preferably the airflow deflecting means 80 further comprise a funnel-shaped inlet port 160 (FIGS. 3A and 3B) facing the blower 45, from which the airflow deflecting means 80 departs. This inlet port 160 can be integral with the deflector 100.

As depicted in FIGS. 2A and 2B, the cooling system can further comprise a second a heat-sink device 120 facing the first heat-sink 50, having a plurality of second radiant elements 130 protruding from a second common base 140; said second radiant elements 130 being disposed substantially parallel according to said first direction 40 and through which air blown by the same air blower 45 is conveyed. Second radiant elements 130 of said second heat-sink device 120 face said radiant elements 60 of said first heat-sink device 50. Preferably the first heat-sink device 50 and the second heat-sink device 120 are identical and are preferably disposed in a "twin" configuration, that is, disposed in a symmetric manner.

For the above "twin" configuration, the cooling system 10 can further comprise second airflow deflecting means 150 cooperating with said second heat-sink device 120 for deflecting said airflow from said first direction 40 according to a third direction 304 which significantly deviates from said first direction 40. Preferably, the third direction 304 is substantially transversal to said first direction 40 and substantially symmetrical to said second direction 90, preferably opposite to said second direction 90. At least one of said deflected airflows 90, 304 is directed to impinge on electronic components 170 not connected to said first or second heat-sink device 50, 120.

Preferably the outlet of the air blower 45 can be mounted with an upper vertical offset O with respect to heat-sink top surface 61 and/or 121 so that a separate portion of the airflow generated by the blower 45 flowing above the heat-sink according to the first direction 40, is created in order to be deflected.

Preferably, the air blower is a centrifugal blower 45 facing said first and/or said second heat-sinks devices 50, 120. Preferably the first airflow deflecting means 80, alone or in combination with the second airflow deflecting means 150 comprise a funnel-shaped inlet port 160 facing the air blower 45, from which said airflow deflecting means 80 in eventual combination with said second airflow deflecting means 150, depart. The inlet port 160 conveys the airflow generated by the air blower 45 at least through radiant elements 60 of the first heat-sink device 50, and eventually through the second radiant elements of 130 the second heat-sink device 120, and more advantageously through one or more air deflecting means 80, 150.

In a first configuration, shown in FIGS. 4A and 4B, the air deflecting means 80 comprise a first air deflector 100, preferably presenting a first curved side wall 30 and preferably placed on the top surface 61 of the first heat-sink device 50 and wherein the second air deflecting means 150 comprise a second air deflector 180, preferably presenting a second curved sidewall 230 and preferably placed on the top surface 121 of the second heat-sink device 120, wherein the second air deflector 180 is preferably symmetric to said first air deflector 100.

Figure 6A:
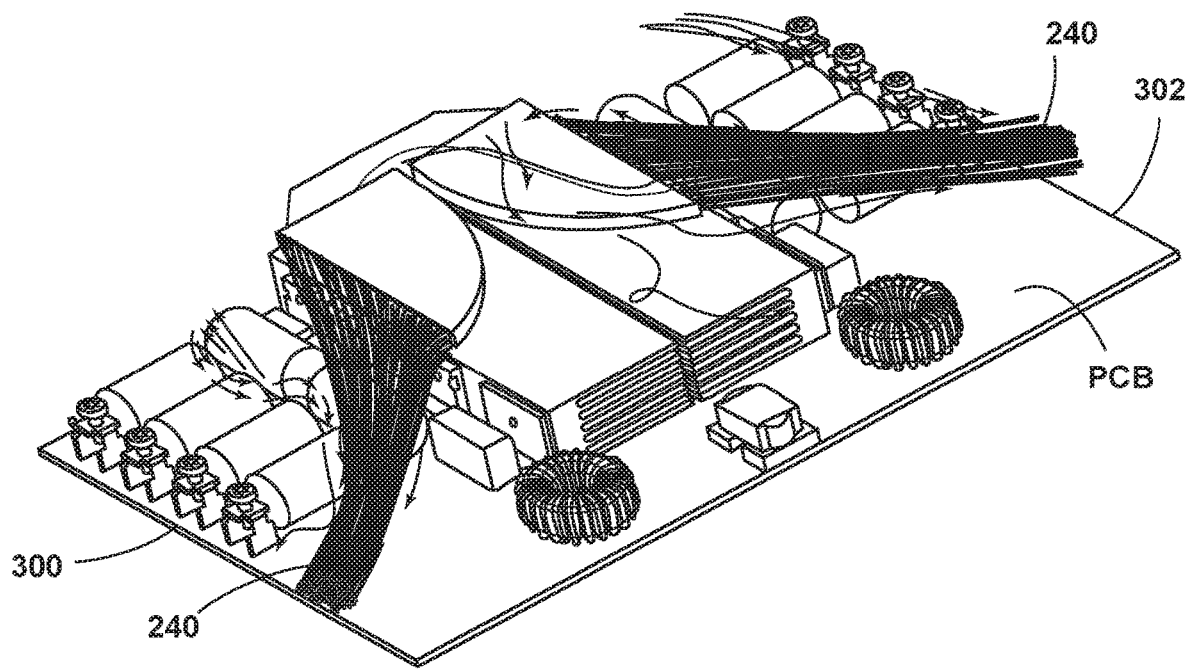
FIGS. 6A and 6B are graphic representations of the cooling airstreams generated with the "twin" configuration of the cooling system according to the present disclosure.
Figure 6B:
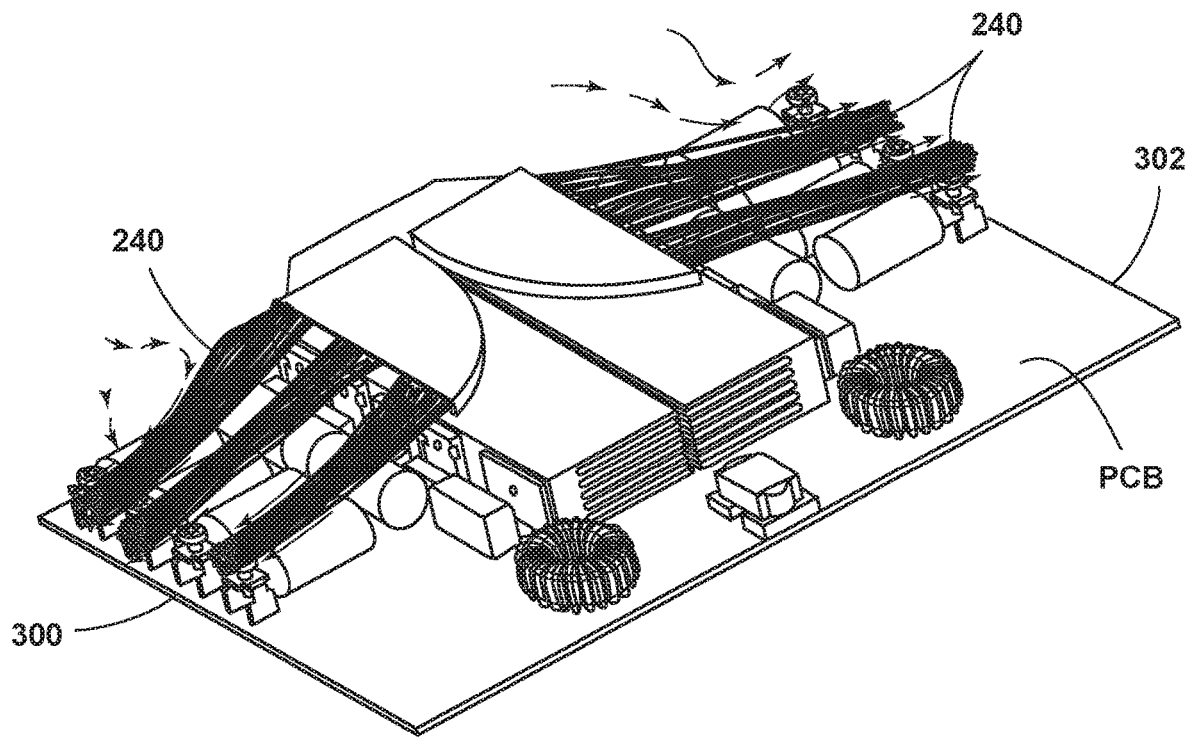

Effects of such cooling systems including the airflow deflecting means of FIGS. 3A and 3B and FIGS. 4A and 4B are respectively represented in FIGS. 6A and 6B.

Preferably, the first heat-sink device 50 is spaced apart from said second heat-sink device 120. In such configuration, as shown in FIGS. 2A and 2B, the first airflow deflecting means 80 and the second airflow deflecting means 150 preferably comprise respectively a first air deflector 100 and a second air deflector 180, both preferably provided with curved side wall 30, 230 and preferably disposed symmetrically with respect to the heat-sink device 50, and preferably leaving a free gap between the first and the second heat-sink 50, 120. Due to the fact that both the heat-sinks 50, 120 do not form a sealed channel, the air flowing into the first and the second heat-sinks 50, 120 are free to "leak" along the flowing path of the first direction 40. An additional air spillage 190 from the gap between the heat-sink top surfaces 61, 121 and the upper inductor support is therefore obtained, for the purpose of cooling other components placed above the first and the second heat-sinks 50, 120, in particular the induction coils.

In an alternative embodiment shown in FIG. 5A and in FIG. 5B, the first airflow deflector 100 and the second airflow deflector 180 are preferably disposed symmetrically with the respective heat-sinks 50 and 120. Preferably the deflectors comprise curved side walls 30, 230 and curved ribs 110 substantially parallel said curved side walls 30 and 230. Preferably said ribs 100 are plastic strips glued to a substantially flat top-surface 61 and/or 121 of at least one of the heat-sink devices 50 and 120. The first air deflector 100 and the second air deflector 180 are defined when an above substantially flat plate 200 is coupled with the ribs 110, preferably supported by them. Preferably, said substantially flat plate 200 is the support for the inductors. In an alternative embodiment said ribs are fixed to an upper plate 200, preferably integral with it which can advantageously be an inductor support 200. A curved air channel is defined when the plate 200 is assembled with the ribs 110 on the related flat top-surface 61 and/or 121 on at least one the underneath heat-sinks 50, 120.

When coupled with said ribs 110, said substantially flat plate 200 preferably covers the majority of both the heat-sink devices 50 120, leaving open only the gap between the first and the second heat-sinks 50, 120.

In any of the above described embodiments comprising the funnel-shaped inlet port 160 facing the air blower 45, from which deflecting means 80 and/or 150 depart, the funnel-shaped inlet port 160 and the deflecting means 80, 150 are preferably formed together in a single piece.

It has been so disclosed an induction hob provided a compact cooling system provided with an improved efficiency, and cooling system with an improved efficiency for such hobs, and its use thereof.

It is here remarked that any feature disclosed in the above with reference to a single embodiment can be combined with any other feature disclosed in regard of the same or other embodiments, generating further configurations of the cooling system according to the present disclosure.

It will be understood by one having ordinary skill in the art that construction of the described device and other components is not limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

What is claimed is:

1. A cooling system for an induction cooking hob comprising:
an air blower for generating a main airflow in a first direction;
an electronic board having a first end and a second end, wherein the electronic board is positioned proximate the air blower;
a first heat-sink device and a second heat-sink device through which the main airflow is conveyed, wherein the first heat-sink device and the second heat-sink device are positioned between the first end and the second end of the electronic board;
electronic components positioned between an edge of the first heat-sink device and the first end of the electronic board and between an edge of the second heat-sink device and the second end of the electronic board;
a first deflector disposed on the first heat-sink device, wherein the first deflector is a first duct extending from a first inlet toward a first outlet substantially aligned with the edge of the first heat-sink device, and wherein the first deflector deflects a first portion of the main airflow in a second direction toward the first end of the electronic board; and
a second deflector disposed on the second heat-sink device adjacent the first deflector, wherein the second deflector is a second duct extending from a second inlet toward a second outlet substantially aligned with the edge of the second heat-sink device, and wherein the second deflector deflects a second portion of the main airflow in a third direction toward the second end of the electronic board, the second duct positioned to mirror the first duct and wherein the third direction generally opposes the second direction.

2. The cooling system according to claim 1, wherein each of the first heat-sink device and the second heat-sink device has a plurality of radiant elements, each of the plurality of radiant elements being disposed parallel to the first direction.

3. The cooling system according to claim 2, wherein each of the plurality of radiant elements of the first and second heat-sink devices are fins obtained through material extrusion according to a longitudinal direction which corresponds to the first direction.

4. The cooling system according to claim 1, wherein the air blower is a centrifugal blower facing the first and second heat-sink devices.

5. The cooling system according to claim 1, wherein each of the first deflector and the second deflector includes a curved side wall.

6. The cooling system according to claim 5, wherein each of the first deflector and the second deflector comprises a plurality of ribs parallel to the curved side wall for deflecting the first portion of the main airflow from the first direction to the second direction and to the third direction.

7. The cooling system according to claim 1, wherein the first deflector and the second deflector extend on the first heat-sink device and the second heat-sink device, respectively.

8. The cooling system according to claim 1, wherein the air blower is provided with an upper vertical offset with respect to a top surface of at least one of the first and second heat-sink devices.

9. The cooling system according to claim 1, wherein the first deflector and the second deflector are in communication with a funnel-shaped inlet port facing the air blower from which the first deflector and the second deflector depart.

10. The cooling system according to claim 1, wherein at least one of the first portion and the second portion of the main airflow is directed to impinge on a portion of a plurality of electronic components spaced from the first heat-sink device and the second heat-sink device.

11. The cooling system according to claim 1, wherein a gap is defined between the first deflector and the second deflector.

12. A cooling system for an induction cooking hob comprising:
an air blower for generating a main airflow according to a first direction;

an electronic board having a first end and a second end, wherein the electronic board is positioned proximate the air blower;

first and second adjacent heat-sink devices, wherein the main airflow extends across the first and second adjacent heat-sink devices;

electronic components positioned between an edge of one of the first and second adjacent heat-sink devices and the first and second ends of the electronic board, respectively;

a first plurality of radiant elements protruding from the first heat-sink device and a second plurality of radiant elements protruding from the second heat-sink device, wherein a first portion of the main airflow is directed through the first plurality of radiant elements and the second plurality of radiant elements; and a deflector cooperating with the first and second adjacent heat-sink devices such that a second portion of the main airflow is transversely deflected from the first direction to a second direction, the deflector extending outward toward the edge of one of the first and second adjacent heat-sink devices, wherein the second direction is toward one of the first and second ends of the electronic board, and further wherein the second portion of the main airflow is spillage from the first portion of the main airflow.

13. The cooling system according to claim 12, wherein the deflector is provided with a curved side wall.

14. The cooling system according to claim 12, wherein the air blower is provided with an upper vertical offset with respect to a top surface of at least one of the first and second adjacent heat-sink devices.

15. The cooling system according to claim 12, further comprising:

a funnel-shaped inlet port facing the air blower from which the deflector departs.

16. The cooling system according to claim 12, wherein the second portion of the main airflow is directed to impinge on the electronic components not connected to the first and second adjacent heat-sink devices.

17. A cooling system for an induction cooking hob comprising:

an air blower for generating an airflow according to a first direction;

a first heat-sink device and a second heat-sink device disposed on a circuit board through which the airflow blown by the air blower is conveyed, wherein the first heat-sink device and the second heat-sink device are adjacent; and first and second deflectors positioned on a top surface of the first heat-sink device and the second heat-sink device, respectively, such that an inlet of the first deflector is positioned proximate an inlet of the second deflector, wherein each of the first and second deflectors includes an arc-shaped plate positioned parallel to the top surface of the respective heat-sink device and a curved side wall for deflecting a first portion of the airflow from the first direction to a second direction and a third direction, respectively, wherein the airflow in the second direction is diametrically opposed to the airflow in the third direction, and further wherein the airflow blown in the second direction and the third direction cools electronic components positioned on opposite sides of the circuit board.

18. The cooling system according to claim 17, wherein the first and second heat-sink devices have a plurality of radiant elements protruding from a common base, the radiant elements being disposed parallel according to the first direction.

19. The cooling system according to claim 17, wherein each of the first and second deflectors comprises a plurality of ribs parallel to the side wall for deflecting the first portion of the airflow from the first direction to the second direction and the third direction, respectively.

* * * * *